US006960487B2

(12) United States Patent
Suzuki et al.

(10) Patent No.: US 6,960,487 B2
(45) Date of Patent: Nov. 1, 2005

(54) METHOD FOR MANUFACTURING A DYNAMIC QUANTITY DETECTION DEVICE

(75) Inventors: Yasutoshi Suzuki, Okazaki (JP); Shinji Yoshihara, Nagoya (JP); Takahiko Yoshida, Okazaki (JP)

(73) Assignees: Nippon Soken, Inc., Nishio (JP); Denso Corporation, Kariya (JP)

(*) Notice: Subject to any disclaimer, the term of this patent is extended or adjusted under 35 U.S.C. 154(b) by 0 days.

(21) Appl. No.: 10/404,073

(22) Filed: Apr. 2, 2003

(65) Prior Publication Data

US 2003/0194836 A1 Oct. 16, 2003

(30) Foreign Application Priority Data

Apr. 10, 2002 (JP) ..................................... 2002-107856

(51) Int. Cl.[7] ............................................. H01L 21/58
(52) U.S. Cl. .......................... 438/51; 438/53; 438/121
(58) Field of Search ................. 257/E27.006, E23.006; 438/51, 53, 121, 456, FOR 381; 148/DIG. 12

(56) References Cited

U.S. PATENT DOCUMENTS

| | | | | |
|---|---|---|---|---|
| 3,397,278 | A | * | 8/1968 | Pomerantz ................. 257/650 |
| 4,040,172 | A | * | 8/1977 | Kurtz et al. .................. 438/51 |
| 4,712,082 | A | * | 12/1987 | Ito et al. ......................... 338/4 |
| 5,413,955 | A | * | 5/1995 | Lee et al. .................... 438/456 |
| 5,444,901 | A | * | 8/1995 | Wiegand et al. ........... 29/25.42 |
| 5,635,649 | A | * | 6/1997 | Tobita et al. .................. 73/717 |
| 5,643,803 | A | | 7/1997 | Fukada et al. |
| 5,829,665 | A | * | 11/1998 | Yoneyama et al. ...... 228/124.1 |
| 5,889,211 | A | * | 3/1999 | Maudie et al. ................ 73/720 |
| 6,595,067 | B2 | * | 7/2003 | Suzuki et al. ................. 73/754 |
| 2002/0053916 | A1 | * | 5/2002 | Tanizawa .................... 324/713 |
| 2004/0007068 | A1 | * | 1/2004 | Tanaka et al. ............ 73/514.32 |

FOREIGN PATENT DOCUMENTS

| | | |
|---|---|---|
| JP | A-11-153503 | 6/1999 |
| JP | A-2000-241273 | 9/2000 |
| JP | A-2001-343300 | 12/2001 |

OTHER PUBLICATIONS

Eaton et al., "Wafer Bonding Using Low Temperature Melting Glass", Oct. 13–17, 1991, Extended Abstracts of the Electrochemical Society, vol. 91–2, p. 693.*

Arthur T. Bradley, "Piezoresistive Characteristics of Short-Channel MOSFETs on (100) Silicon," *IEEE Transactions on Electron Devices*, vol. 48, No. 9, Sep. 2001, pp. 2009–2015.

Hiroya Ikeda, "Initial Oxidation Processes and Local Bonding Structures on H–Terminated Si(100) Surfaces", *Hyomen Kagaku*, vol. 17, No. 3, 1996, pp. 141–147 (Abstract is attached).

* cited by examiner

*Primary Examiner*—George Fourson
(74) *Attorney, Agent, or Firm*—Posz Law Group, PLC

(57) ABSTRACT

A method for manufacturing a dynamic quantity detection device includes bonding a semiconductor chip that includes a detection element for detecting a dynamic quantity to a stand using a bonding layer. Initially, a semiconductor chip is formed that includes a detection element used for correlating a dynamic quantity to be detected to an electric quantity and a processing circuit element used for a circuit that processes the electric quantity. Further, a bonding layer is placed on a stand. The semiconductor chip is then placed on the bonding layer and the semiconductor chip is bonded to the stand by sintering the bonding layer at 400° C. or lower in order to suppress a change in a characteristic of the processing circuit element.

12 Claims, 4 Drawing Sheets

METHOD FOR MANUFACTURING A DYNAMIC QUANTITY DETECTION DEVICE

CROSS REFERENCE TO RELATED APPLICATION

This application is based on and incorporates herein by reference Japanese Patent Application No. 2002-107856 filed on Apr. 10, 2002.

BACKGROUND OF THE INVENTION

The present invention relates to a method for manufacturing a dynamic quantity detection device that is formed by bonding a semiconductor chip that includes a detection element for detecting a dynamic quantity to a stand using a bonding layer.

The publication JP-A-2000-241273 discloses such a method in the manufacturing process of a discrete pressure detection device 100 shown in FIGS. 3A and 3B.

As shown in FIGS. 3A and 3B, the discrete pressure detection device 100 includes a metal stem 20, a discrete semiconductor chip 30, and a glass layer 40. The metal stem 20 includes a disk-like diaphragm 10. The semiconductor chip 30 is bonded to the diaphragm 10 with the glass layer 40. The discrete semiconductor chip 30 is in contact with the glass layer 40 at a first surface 31 of the discrete semiconductor chip 30. The diaphragm 10 is in contact with the glass layer 40 at a first surface 11 of the diaphragm 10. The discrete semiconductor chip 30 includes four gauges (detection elements) 51, 52, 53, 54, or four piezo resistors 51, 52, 53, 54. The gauges 51, 52, 53, 54 are located in a second surface 32 of the chip 30, which is opposite to the first surface 31. The glass layer 40 is, for example, made of a low melting point glass.

When a medium that transmits pressure to be detected is introduced into the stem 20 to apply the pressure to a second surface 12 of the diaphragm 10, which is opposite to the first surface 11, the diaphragm 10 strains and the discrete semiconductor chip 30 also strains synchronously to change the resistances of the gauges 51, 52, 53, 54. The resistance changes are processed by a processing circuit, which is not shown in the figure, in order to detect the pressure. The processing circuit is provided in another chip outside the discrete semiconductor chip 30 and includes processing circuit elements such as a bipolar transistor and a trimming resistor.

Because the processing circuit is located in another chip, the system that includes the discrete pressure detection device 100 and the chip including the processing circuit is relatively bulky. To address the issue of the bulkiness of the system, the inventors of the present invention attempted to integrate gauges 51, 52, 53, 54 and processing circuit elements for making up a processing circuit equivalent to the foregoing processing circuit in an intelligent semiconductor chip 33 and to form an intelligent pressure detection device 101, which is shown in FIGS. 4A and 4B. The processing circuit elements are included in a processing circuit area 70.

However, it turned out that the following issue was caused when the intelligent pressure detection device 101 was manufactured using the intelligent semiconductor chip 33. When the discrete pressure detection device 100 of FIGS. 3A and 3B is manufactured, the discrete semiconductor chip 30 is normally bonded to the metal stem 20 by sintering the glass layer 40 at a temperature of approximately 500° C. However, when the glass layer 40 was sintered at a temperature of approximately 500° C. the characteristics of a bipolar transistor, which is included in the processing circuit area 70 as a processing circuit element, changed.

The characteristics change of the bipolar transistor may be caused by the following mechanism. Although not shown in the figure, the intelligent semiconductor chip 33 includes a substrate, which is made of silicon. Wiring lines, which electrically interconnect elements such as a bipolar transistor located in a surface of the substrate, an oxide film, which insulates the wiring lines, and a passivation film, which protects the wiring lines and the oxide film, are located on the surface of the substrate. The oxide film and the passivation film are formed in the atmosphere that contains hydrogen in the wafer manufacturing process, in which a wafer is processed for manufacturing the intelligent semiconductor chip 33.

When the oxide film and the passivation film are formed, the hydrogen in the atmosphere is absorbed into the oxide film and the passivation film as hydrogen ions. The dangling bonds of the silicon atoms located at the interface between the surface of the substrate and the oxide film are terminated by the hydrogen ions. At a subsequent step in the wafer manufacturing process, the wafer is heated at a high temperature in the atmosphere that contains hydrogen. During the step, the amount of hydrogen ions in the oxide film and the passivation film can increase as hydrogen in the atmosphere is absorbed, and the bonds between the hydrogen-terminated silicon atoms and the terminating hydrogen atoms at the interface between the surface of the substrate and the oxide film may be broken due to the high temperature.

At a later step, the wafer is diced to form the intelligent semiconductor chip 33. Because no heat is applied to the intelligent semiconductor chip 33 during the dicing step, the characteristics of the bi-polar transistor such as current amplification factor in the wafer manufacturing process is substantially determined by the concentration of the hydrogen ions resulting from the above high temperature treatment.

However, when the glass layer 40 is sintered for bonding the intelligent semiconductor chip 33 to the metal stem 20, the processing circuit area 70 is heated. As a result, the hydrogen atoms bonded to the silicon atoms at the interface between the surface of the substrate and the oxide film move away from the silicon atoms, and the hydrogen ions absorbed in the oxide film migrate toward the passivation film or get outgassed into the atmosphere.

As a result, electrons trapped by the hydrogen atoms included in the oxide film are released above the surface of the bipolar transistor located in the processing circuit area 70, and the transistor injection efficiency increases. Consequently, the base current increases, and the collector current also increases among the currents that flow through the base, the emitter, and the collector of the bipolar transistor. Thus, the current amplification factor, which is one of the characteristics of the bipolar transistor, increases.

SUMMARY OF THE INVENTION

The present invention has been made in view of the above aspects concerning a method for bonding a semiconductor chip. The method includes a detection element used for correlating a dynamic quantity to be detected to an electric quantity and a processing circuit element used for making up a circuit that processes the electric quantity. The method includes bonding the semiconductor chip to a stand using a bonding layer in a manufacturing process to a dynamic quantity detection device. An object or the present invention is to suppress the change in a characteristic of the processing circuit element when the bonding layer is sintered to bond the semiconductor chip to the stand.

To achieve the object, a method according to the present invention for manufacturing a dynamic quantity detection device includes: forming a semiconductor chip that includes a detection element used for correlating a dynamic quantity to be detected to an electric quantity and a processing circuit element used for making up a circuit that processes the electric quantity; placing a bonding layer on a stand; placing the semiconductor chip on the bonding layer; and bonding the semiconductor chip to the stand by sintering the bonding layer at 400° C. or lower.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1A:
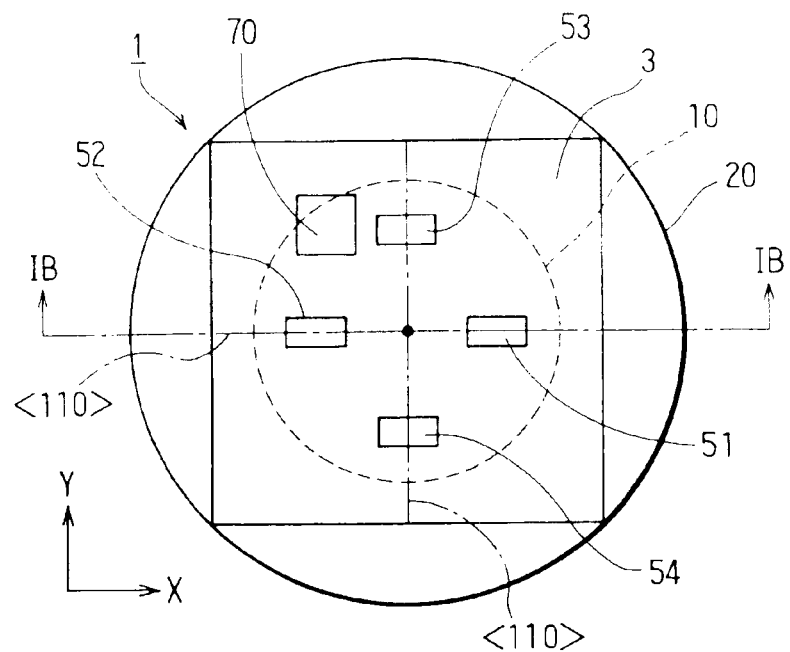
FIG. 1A is a plan view of a pressure detection device manufactured with a method according to an embodiment of the present invention.
Figure 1B:
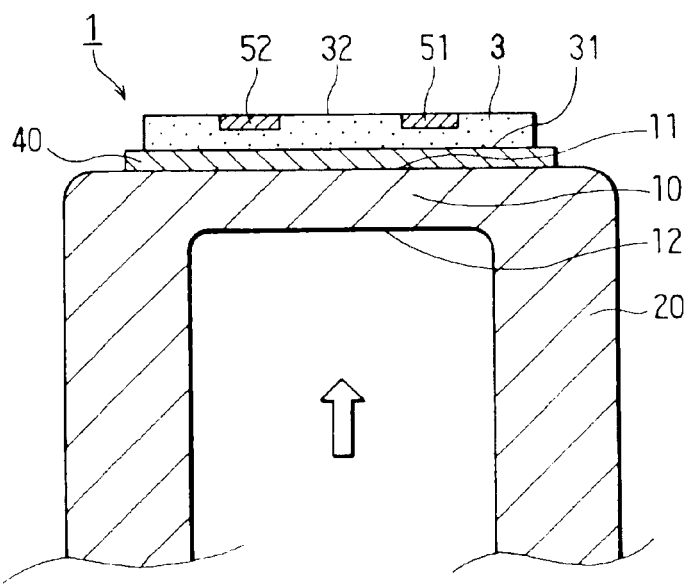
FIG. 1B is a cross-sectional view of the device of FIG. 1A taken along the line IB—IB in FIG. 1A.

The present invention will be described in detail with reference to an embodiment. As shown in FIGS. 1A and 1B, a dynamic quantity detection device according to an embodiment is an intelligent pressure detection device 1. The pressure detection device 1 of FIGS. 1A and 1B is used, for example, for controlling the fuel injection pressure in an engine or the brake pressure for the wheels of a vehicle.

As shown in FIGS. 1A and 1B, the device 1 includes a metal stem 20 (stand), an intelligent semiconductor chip 3, and a glass layer 40. The metal stem 20 includes a disk-like diaphragm 10. The chip 3 is bonded to the diaphragm 10 using the glass layer 40. The chip 3 is in contact with the glass layer 40 at a first surface 31 of the chip 3. The diaphragm 10 is in contact with the glass layer 40 at a first surface 11 of the diaphragm 10. The chip 3 includes four rectangular gauges (detection elements) 51, 52, 53, 54, or four piezo resistors 51, 52, 53, 54, and processing circuit elements.

Although not shown in the figure, the gauges 51, 52, 53, 54 are electrically interconnected by wiring lines to form a bridge circuit. The processing circuit elements are used for making up a circuit for processing an electric quantity such as current or potential outputted from the bridge circuit. As shown in FIGS. 1A and 1B, the gauges 51, 52, 53, 54 are located in a second surface 32 of the chip 3, which is opposite to the first surface 31, above the diaphragm 10. The processing circuit elements are included in a processing circuit area 70, which is located in the second surface 32 of the chip 3.

When a medium such as gas and liquid that transmits, for example, the fuel injection pressure in an engine is introduced into the stem 20 to apply the pressure to a second surface 12 of the diaphragm 10, which is opposite to the first surface 11, the diaphragm 10 strains and the chip 3 also strains synchronously to change the resistances of the gauges 51, 52, 53, 54. The resistance changes vary the electric quantity outputted from the bridge circuit, and the electric quantity is processed by the circuit included in the processing circuit area 70 in order to detect the pressure.

The metal stem 20 is formed in the shape of a hollow cylinder by, for example, cutting. The metal stem 20 is made of, for example, KOVAR, which is a Fe—Ni—Co alloy having a thermal expansion coefficient approximately equal to that of a glass. The diaphragm 10 is located on a first end of the metal stem 20. The medium, which transmits pressure, is introduced from a second end of the metal stem 20, which is not shown in the figure but is opposite to the first end, in a direction shown by the arrow in FIG. 1B in order to apply pressure to the second surface 12 of the diaphragm 10. The dimensions of the metal stem 20 are, for example, 6.5 mm for the outer diameter and 2.5 mm for the inner diameter. The thickness of the diaphragm 10 is 0.65 mm if the maximum detected pressure is, for example, 20 Mpa, and 1.40 mm if the maximum detected pressure is, for example, 200 MPa.

Figure 2:
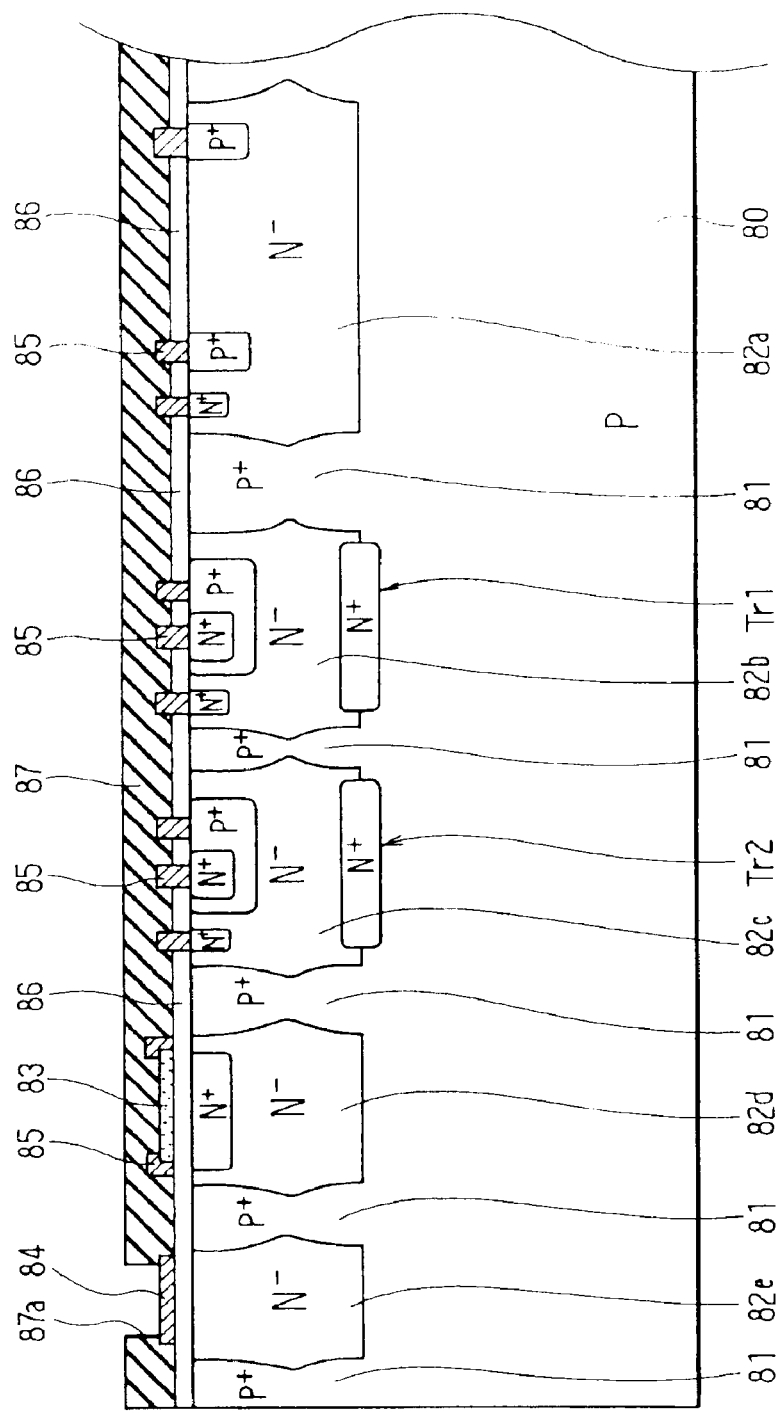
FIG. 2 is a partial cross-sectional view of the semiconductor chip in FIGS. 1A and 1B.

As shown in FIG. 2, the semiconductor chip 3 includes a plate-like p-type single crystal silicon substrate 80 that has a uniform thickness. The surface of the silicon substrate 80 that is located on the side of the second surface 32 of the chip 3 is planar and has a face orientation of (100). The dimensions of the semiconductor chip 3 are, for example, 4.0 mm×4.0 mm for the length and width of the planar surface and 0.2 mm for the thickness. The glass layer 40 is made of, for example, a low melting point glass. The thickness of the glass layer 40 is, for example, 0.06 mm.

The surface of the silicon substrate 80 has a face orientation of (100), so the substrate 80 has two crystal axes of <110>, which are orthogonal to each other and parallel to the surface of the silicon substrate 80, as shown in FIG. 1A. In FIG. 1A, one of the crystal axes of <110> is parallel to the X-axis, while the other orientation axis <110> is parallel to the Y-axis. As shown in FIG. 1A, the gauges 51, 52, 53, 54 are arranged such that the longitudinal directions of them are parallel to the X-axis, while the lateral directions of them are parallel to the Y-axis.

The processing circuit elements, which are located in the processing circuit area 70 in the second surface 32 of the semiconductor chip 3, are ones such as a bipolar transistor and a trimming resistor. Although not shown in the figure, the processing circuit elements are electrically connected to the gauges 51, 52, 53, 54 by wiring lines.

Next, the cross-sectional structure of the semiconductor chip 3 will be described in detail. As shown in FIG. 2, a plurality of $n^-$ epitaxial regions 82$a$, 82$b$, 82$c$, 82$d$, 82$e$, which are isolated from one another by $p^+$ isolating regions 81, are located in the surface of the semiconductor substrate 80. The gauges 51, 52, 53, 54 are located in the surface of one of the epitaxial regions 82$a$.

As shown in FIG. 2, two transistors Tr1, Tr2 for making up an operational amplifier are formed using two of the epitaxial regions 82b, 82c, respectively. A trimming resistor 83, which is used for adjusting the characteristics of the operational amplifier is located on one of the epitaxial regions 82d. The trimming resistor 83 is made of for example, chromium silicon (CrSi). An electrode pad 84, which is used for electrically connecting the semiconductor chip 30 to an external circuit, is located on one of the epitaxial regions 82e. The electrode pad 84 is made of for example, aluminum. The transistors Tr1, Tr2, the trimming resistor 83, and the electrode pad 84 are included in the processing circuit area 70.

Although not illustrated in the figure, other epitaxial regions are located in the surface of the semiconductor substrate 80 and also electrically isolated from one another by other p+ isolation regions 81. Other resistors and transistors are located in the other epitaxial regions.

A silicon oxide film ($SiO_2$) 86 are located on the surface of the semiconductor substrate 80. Aluminum wiring lines 85, which electrically interconnect the gauges 51, 52, 53, 54, the transistors Tr1, Tr2, the trimming resistor 83, and the electrode pad 84, are insulated from the semiconductor substrate 80 at their predetermined portions by the silicon oxide film 86. A passivation film 87, which is a protective film, is located on the aluminum wiring lines 85 and the silicon oxide film 86. The passivation film 87 has an opening 87a for wire bonding, as shown in FIG. 2. The passivation film 87 is made of, for example, a plasma silicon nitride film (P-SiN).

Next, a method for manufacturing the pressure detection device 1 of FIGS. 1A and 1B will be briefly described. Firstly, a semiconductor chip 3 that includes gauges 51, 52, 53, 54 and processing circuit elements, which are ones such as a transistor Tr1, Tr2 and a trimming resistor 83, and a metal stem 20 are prepared. Then, a glass layer 40 that is made of, for example, a low melting point glass is placed at a predetermined position on a first surface 11 of a diaphragm 10 of the metal stem 20, and the semiconductor chip 3 is placed on top of the glass layer 40. Then, the combined unit 20, 40, 3 is transferred into a sintering furnace, which is not shown in the figure, and the glass layer 40 is sintered at approximately 400° C. to bond the semiconductor chip 3 to the metal stem 20. As a result of the sintering, the pressure detection device 1 of FIGS. 1A and 1B is formed.

As shown in FIG. 1A, the gauges 51, 52, 53, 54 and the processing circuit elements, which are included in the processing circuit area 70, are integrated in the semiconductor chip 3 of the pressure detection device 1. Therefore, it is possible to make a system that includes the intelligent pressure detection device 1 of FIGS. 1A and 1B smaller than a system that includes the discrete pressure detection device 100 of FIGS. 3A and 3B.

Figure 3A:
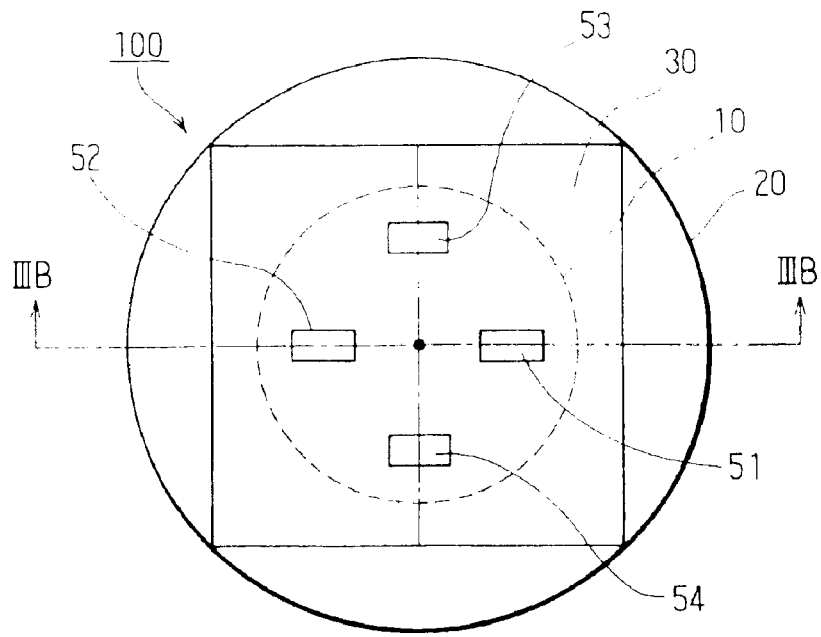
FIG. 3A is a plan view of a proposed pressure detection device.
Figure 3B:
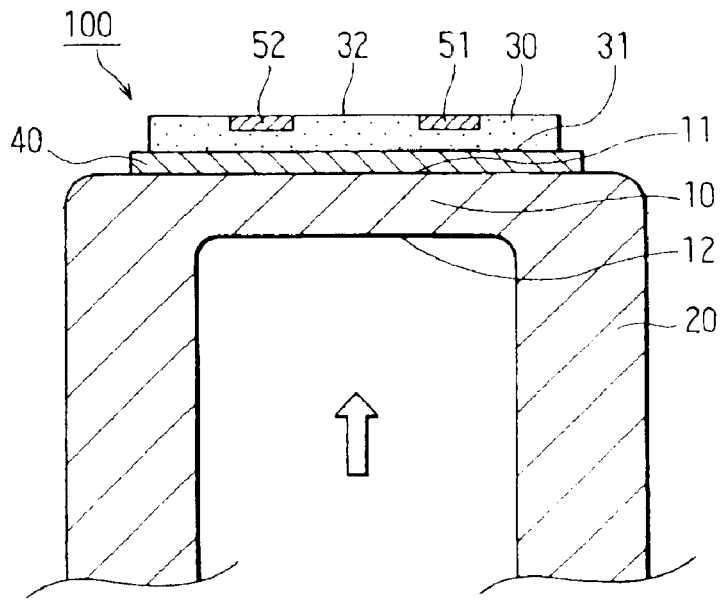
FIG. 3B is a cross-sectional view of the device of FIG. 3A taken along the line IIIB—IIIB.
Figure 4A:
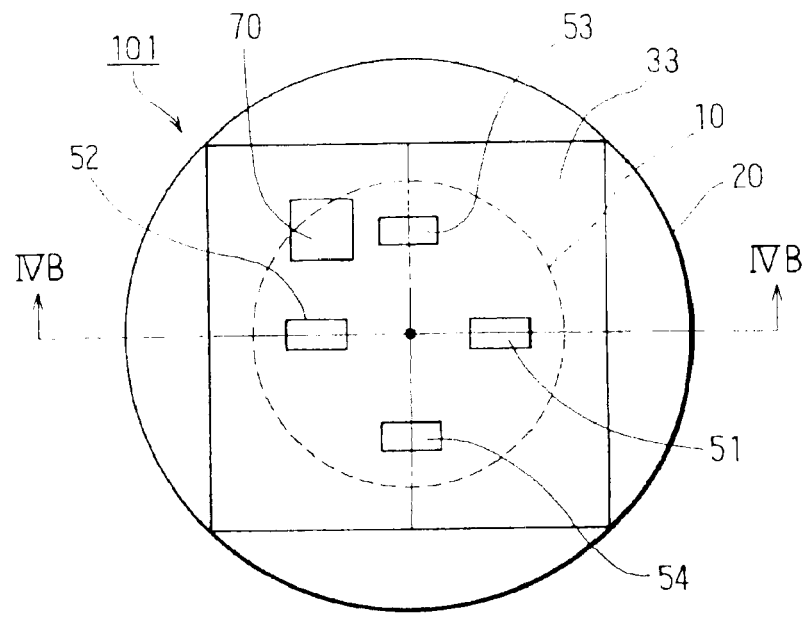
FIG. 4A is a plan view of a pressure detection device, in which a semiconductor chip including processing circuit elements has been bonded to a stand using the same method used for the proposed device of FIGS. 3A and 3B.
Figure 4B:
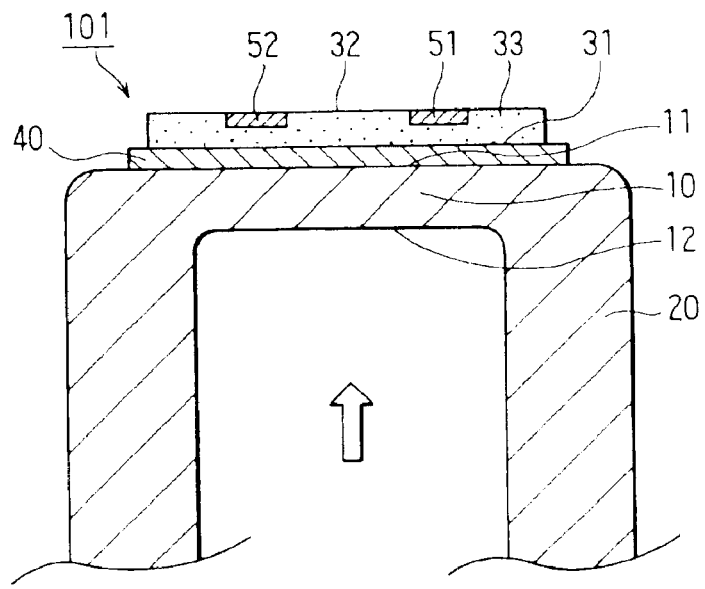
FIG. 4B is a cross-sectional view of the device in FIG. 4A taken along the line IVB—IVB.

In the manufacturing process of the pressure detection device 1 of FIGS. 1A and 1B, the glass layer 40 is sintered at approximately 400° C. However, if the glass layer 40 was sintered at approximately 500° C., at which the glass layer 40 of the discrete pressure detection device 100 of FIGS. 3A and 3B is sintered, the characteristics of the transistor Tr1, Tr2, which are included in the processing circuit area 70 as the processing circuit elements, would change due to the following reasons.

As described, the semiconductor chip 3 includes the p-type single crystal silicon substrate 80, and the aluminum lines 85, the silicon oxide film 86, and the passivation film 87 are located on the surface of the substrate 80. The silicon oxide film 86 and the passivation film 87 are formed in the atmosphere that contains hydrogen in the wafer manufacturing process, in which a wafer is processed for manufacturing the semiconductor chip 3. When the silicon oxide film 86 and the passivation film 87 are formed, the hydrogen in the atmosphere is absorbed into the silicon oxide film 86 and the passivation film 87 as hydrogen ions. The dangling bonds of the silicon atoms located at the interface between the surface of the substrate 80 and the silicon oxide film 86 are terminated by the hydrogen ions. At a subsequent step in the wafer manufacturing process, the wafer is heated at a high temperature in the atmosphere that contains hydrogen. During the step, the amount of hydrogen ions in the silicon oxide film 86 and the passivation film 87 can increase as hydrogen in the atmosphere is absorbed, and the bonds between the hydrogen-terminated silicon atoms and the terminating hydrogen atoms at the interface between the surface of the substrate 80 and the silicon oxide film 86 may be broken due to the high temperature.

At a later step, however, if the glass layer 40 was sintered at approximately 500° C., the hydrogen atoms bonded to the silicon atoms at the interface between the surface of the substrate 80 and the silicon oxide film 86 would move away from the silicon atoms, and the hydrogen ions absorbed in the silicon oxide film 86 would migrate toward the passivation film 87 or get outgassed into the atmosphere.

As a result, electrons trapped by the hydrogen atoms included in the silicon oxide film 86 would be released above the surface of the transistors Tr1, Tr2, which are included in the processing circuit area 70, and the transistor injection efficiency of the transistors Tr1, Tr2 would increase. Consequently, the base current would increase, and the collector current would also increase among the currents that flow through the base, the emitter, and the collector of any of the transistors Tr1, Tr2. Thus, the current amplification factor, which is one of the characteristics of the transistors Tr1, Tr2, would increase.

Because of the above-mentioned characteristics change of the transistors Tr1, Tr2, the transistors Tr1, Tr2 would have characteristics different from each other, if the transistors Tr1 Tr2 are placed far apart. As a result, the parity in the operational amplifier, which is formed by the transistors Tr1, Tr2, would be lost, and the characteristics of the operational amplifier would worsen.

Therefore, the glass layer 40 is sintered at approximately 400° C. in the manufacturing process of the pressure detection device 1 of FIGS. 1A and 1B to address the above problem.

Normally, there are two types of bond, monohydride bond and dihydride bond, in the bond between the silicon atoms located at the interface between the surface of the substrate 80 and the silicon oxide film 86 and the hydrogen ions contained in the silicon oxide film 86. In the monohydride bond, a single silicon atom bonds to a single hydrogen ion. In the dihydride bond, a single silicon atom bonds to two hydrogen atoms.

When the semiconductor chip 3 is heated at a temperature above 300° C. below 400° C., one of the two hydrogen atoms bonded to a single silicon atom in dihydride bond separates from the silicon atom. That is, the dihydride bond is broken to transform into a monohydride bond. When the semiconductor chip 3 is heated at a temperature above 400° C., the other of the hydrogen atoms also separates from the silicon atom. That is, the monohydride bond is broken.

Therefore, when the semiconductor chip 3 is bonded to the metal stem 20, if the sintering temperature of the glass layer 40 is set at 400° C. or lower as in the manufacturing process of the pressure detection device 1 of FIGS. 1A and 1B, the monohydride bond is not broken during the sintering. As a result, it is possible to suppress the migration of the hydrogen ions contained in the silicon oxide film 86 toward the passivation film 87 and the outgassing of the hydrogen ions into the atmosphere. Consequently, the electrons trapped by the hydrogen ions contained in the silicon oxide film 86 are not released and remain bound above the surface of the transistors Tr1, Tr2. Therefore, it is possible to suppress the change in the transistor injection efficiency of the transistors Tr1, Tr2. As a result, it is possible to suppress the change in the base currents in the transistors Tr1, Tr2. Thus, it is also possible to suppress the change in the current amplification factors of the transistors Tr1, Tr2.

More preferably, the glass layer 40 should be sintered at a temperature of 300° C. or lower. In that case, it is not only possible to prevent monohydride bond from breaking but also possible to prevent dihydride bond from breaking to transform into monohydride bond. Therefore, the change in the current amplification factors of the transistors Tr1, Tr2 can be suppressed more effectively.

Not only the change in the current amplification factors of the transistors Tr1, Tr2 but also the change in the resistance of the trimming resistor 83 is suppressed if the sintering temperature of the glass layer 40 is set at 400° C. or lower when the semiconductor chip 3 is bonded to the metal stem 20. If the glass layer 40 was sintered at approximately 500° C., the grains of chromium silicon that makes up the trimming resistor 83 would be grown to reduce the resistance of the trimming resistor 83. Therefore, by setting the sintering temperature for the glass layer 40 at 400° C. or lower, more preferably, at 300° C. or lower, the growth of the grains can he suppressed, and the change in the resistance of the trimming resistor 83 is suppressed.

The glass layer 40 used in the pressure detection device 1 of FIGS. 1A and 1B is made of a low melting temperature glass, so it is possible to sinter the glass layer 40 at 400° C. or lower, more preferably, at 300° C. or lower. Furthermore, the glass layer 40 is used as a bonding layer for bonding the semiconductor chip 3 to the metal stem 20, so the durability in the bonding worsens less due to the creeping of the glass layer 40, compared with the case that, for example, a resin adhesive is used as a bonding layer. As a result, it is possible to suppress the deterioration in the performance of the pressure detection device 1 of FIGS. 1A and 1B.

The adjustable range of the resistance of the trimming resistor 83 narrows as the trimming resistor 83 is miniaturized. However, the change in the current amplification factors of the transistors Tr1, Tr2 is suppressed in the pressure detection device 1 of FIGS. 1A and 1B, so the range of resistance that needs to be adjusted by the trimming resistor 83 can be reduced. Consequently, the trimming resistor 83 can be miniaturized, and so can the semiconductor chip 3.

The scope of the present invention is not limited to the pressure detection device 1 of FIGS. 1A and 1B and may be applied to various other dynamic quantity detecting devices such as an acceleration sensor.

What is claimed is:

1. A method for manufacturing a dynamic quantity detection device that is formed by bonding a semiconductor chip that includes a detection element for detecting a dynamic quantity to a stand using a bonding layer, the method comprising:

forming a semiconductor chip that includes a detection element used for correlating a dynamic quantity to be detected to an electric quantity and a processing circuit element used for a circuit that processes the electric quantity, the semiconductor chip being formed from silicon;

placing a bonding layer on a stand which comprises metal;

placing the semiconductor chip on the bonding layer; and bonding the semiconductor chip to the stand by sintering the bonding layer at a temperature less than 300° C. in order to suppress a change in a characteristic of the processing circuit element;

wherein the bonding layer is made of a low melting point glass capable of bonding with the semiconductor chip at a temperature less than 300° C., and wherein the low melting point glass is for bonding the metal of the stand with the silicon of the semiconductor chip.

2. The method according to claim 1, wherein the processing circuit element is a transistor.

3. The method according to claim 1, wherein the stand includes a diaphragm, which is deformable in response to the dynamic quantity, wherein the semiconductor chip is located above the diaphragm.

4. The method according to claim 1, wherein the processing circuit element is a trimming resistor.

5. The method according to claim 4, wherein the trimming resistor is made of chromium silicon.

6. A method for manufacturing a dynamic quantity detection device comprising:

forming a semiconductor chip that includes a detection element used for correlating a dynamic quantity to be detected to an electric quantity, and a processing circuit element for processing the electric quantity, the semiconductor chip formed from silicon;

placing a bonding layer on a stand which comprises metal;

placing the semiconductor chip on the bonding layer; and bonding the semiconductor chip to the stand by sintering the bonding layer at 400° C. or lower in order to suppress a change in a characteristic of the processing circuit element, wherein the processing circuit element is one of a transistor and a trimming resistor and changes characteristics at a temperature higher than 400° C., and wherein the bonding layer is made of a low melting point glass capable of bonding with the semiconductor chip at a temperature less than 400° C., wherein the low melting point glass is for bonding the metal of the stand with the silicon of the semiconductor chip.

7. The method according to claim 6, wherein the stand includes a diaphragm that is deformable in response to the dynamic quantity and that is located above the diaphragm.

8. A method for manufacturing a dynamic quantity detection device comprising:

providing a metal stand;

placing a bonding layer on the metal stand, the bonding layer having a thickness of about 0.06 mm, the bonding layer made of a low melting point glass;

placing a semiconductor chip on the metal stand, the semiconductor chip including detection element for correlating a dynamic quantity to be detected to an electric quantity and a processing circuit element for processing the electric quantity, the semiconductor chip formed of silicon, the low melting point glass for bonding the metal stand with the silicon of the semiconductor chip;

transferring the metal stand, the bonding layer, and the semiconductor chip into a furnace; and bonding the semiconductor chip to the metal stand by sintering the bonding layer at a temperature less than 300° C. in order to suppress a change in a characteristic of the processing circuit element.

9. The method according to claim 8, wherein the processing circuit element is a transistor.

10. The method according to claim 8, wherein the processing circuit element is a trimming resistor.

11. The method according to claim 10, wherein the trimming resistor is made of chromium silicon.

12. The method according to claim 8, wherein the stand includes a diaphragm that is deformable in response to the dynamic quantity and that is located above the diaphragm.

* * * * *